United States Patent
Saegusa et al.

(10) Patent No.: US 8,470,691 B2
(45) Date of Patent: Jun. 25, 2013

(54) METHOD FOR CUTTING SUBSTRATE AND METHOD FOR MANUFACTURING ELECTRONIC ELEMENT

(75) Inventors: Yoshiharu Saegusa, Ichihara (JP); Susumu Sugano, Ichihara (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 77 days.

(21) Appl. No.: 13/146,374

(22) PCT Filed: Jan. 19, 2010

(86) PCT No.: PCT/JP2010/050557
§ 371 (c)(1),
(2), (4) Date: Jul. 26, 2011

(87) PCT Pub. No.: WO2010/087249
PCT Pub. Date: Aug. 5, 2010

(65) Prior Publication Data
US 2011/0287608 A1 Nov. 24, 2011

(30) Foreign Application Priority Data
Jan. 29, 2009 (JP) .................. 2009-017512

(51) Int. Cl.
*H01L 21/00* (2006.01)
*H01L 21/66* (2006.01)
*G01R 31/26* (2006.01)

(52) U.S. Cl.
USPC 438/462; 438/14; 257/E21.599; 257/E21.525

(58) Field of Classification Search
USPC .................................. 438/462, 14
See application file for complete search history.

(56) References Cited

U.S. PATENT DOCUMENTS

| 2005/0009302 A1* | 1/2005 | Wakui et al. ............... 438/464 |
| 2009/0236324 A1 | 9/2009 | Fukuyo et al. |
| 2010/0244040 A1 | 9/2010 | Yokoyama et al. |

FOREIGN PATENT DOCUMENTS

| JP | 61-280906 A | 12/1986 |
| JP | 2004-039931 A | 2/2004 |
| JP | 2006-245263 A | 9/2006 |
| JP | 2008-124060 A | 5/2008 |

OTHER PUBLICATIONS

German Office Action issued Mar. 1, 2013 for counterpart German Patent Application No. 11 2010 000 771.3.

* cited by examiner

Primary Examiner — Michelle Mandala
Assistant Examiner — Shaka White
(74) Attorney, Agent, or Firm — Sughrue Mion, PLLC

(57) ABSTRACT

An image pickup section picks up images of a pair of targets formed on a substrate with a cutting line interposed therebetween (S101). An extracting section extracts the targets from the images (S102). Then, a measuring section measures the distance d1 between the targets (S103). When a driving section presses a blade against the substrate (S104), the substrate is pressed by the blade to become warped and starts to break. Thus, the image pickup section picks up images of the targets again (S105), and the extracting section extracts the targets from the images (S106). The measuring section measures the distance d2 between the targets (S107). A determining section determines the cutting state of the substrate from the amount of change (d2−d1) of the distances between the targets (S108). Thereby, a method for cutting a substrate and a method for manufacturing electronic elements using the method are provided by which the cutting situation of the substrate can be judged at the time of cutting the substrate into chips by breaking.

10 Claims, 6 Drawing Sheets

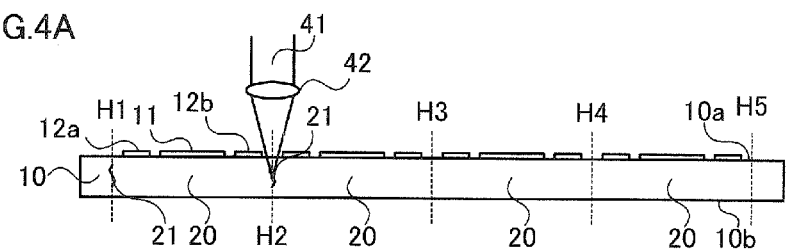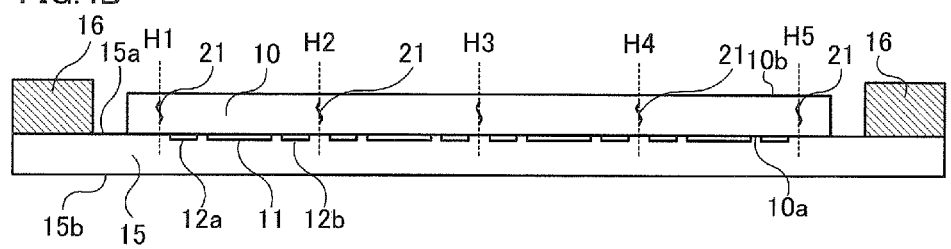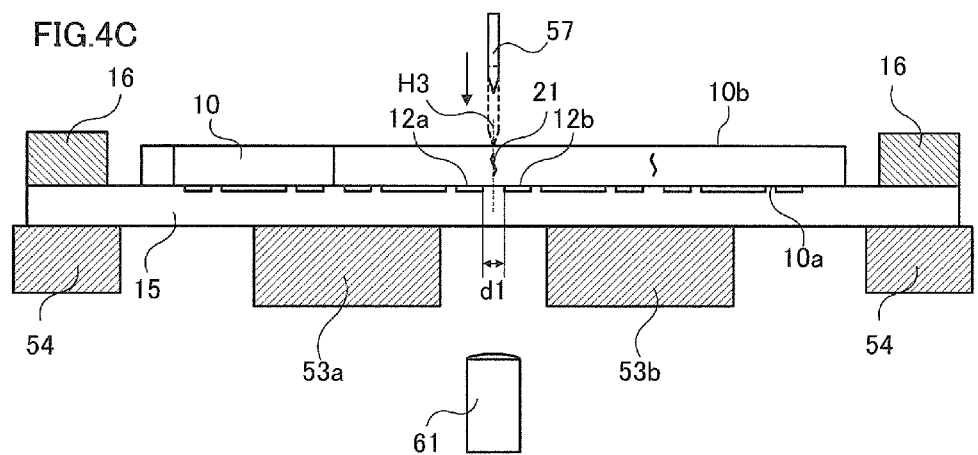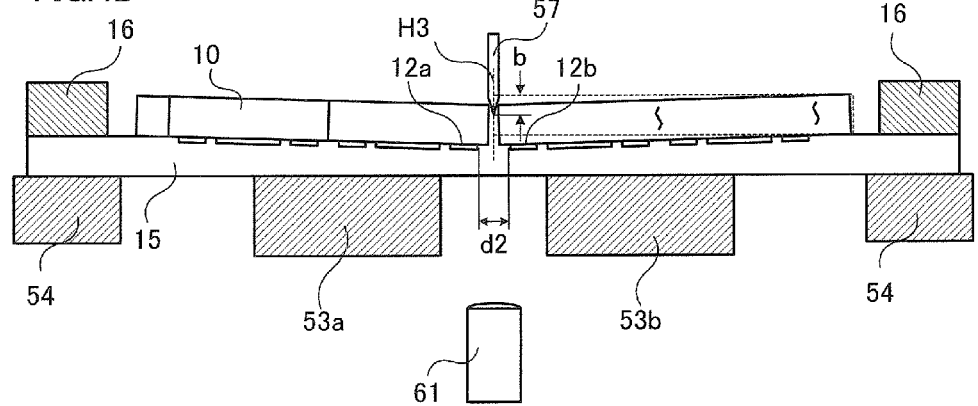

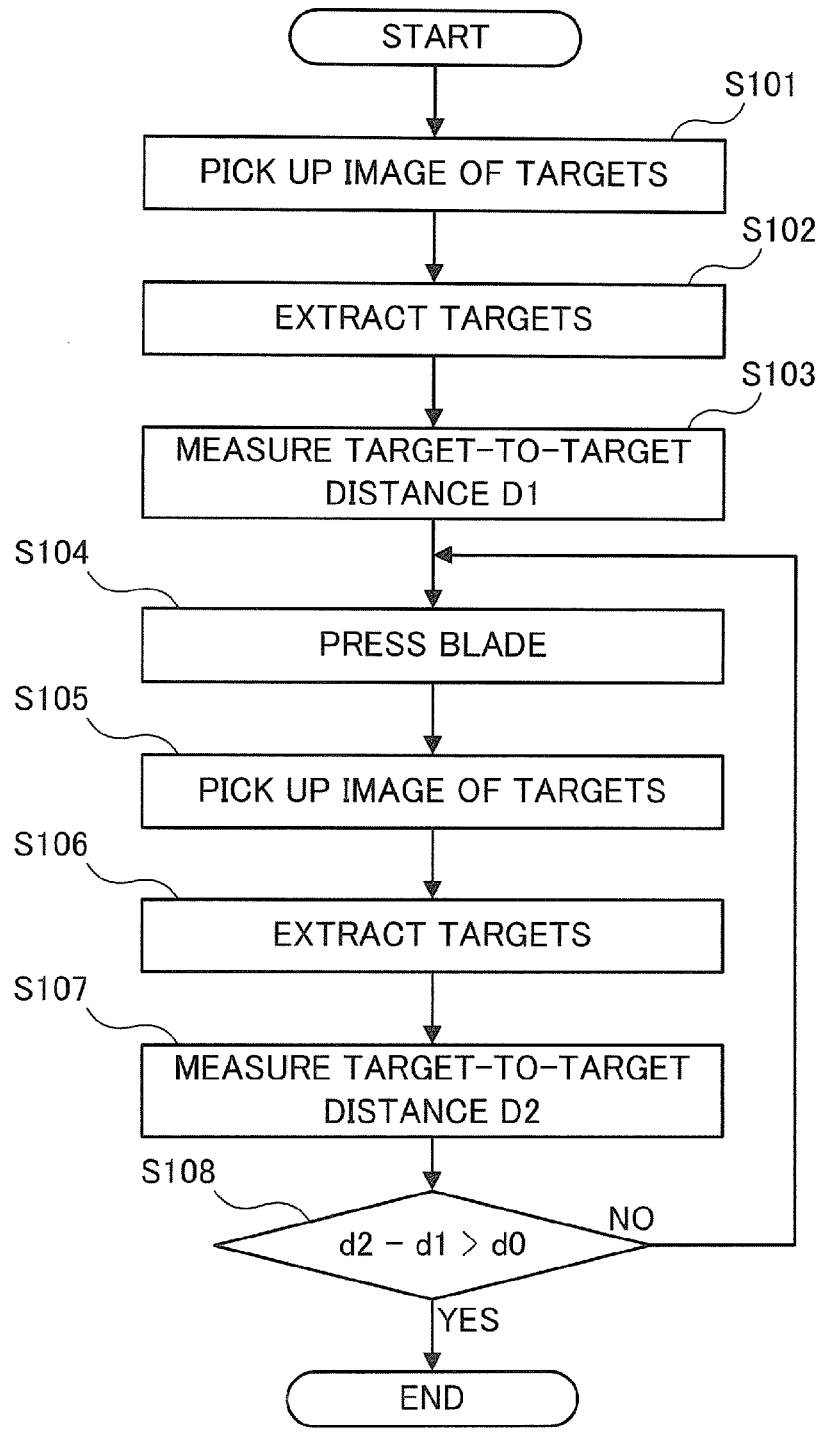

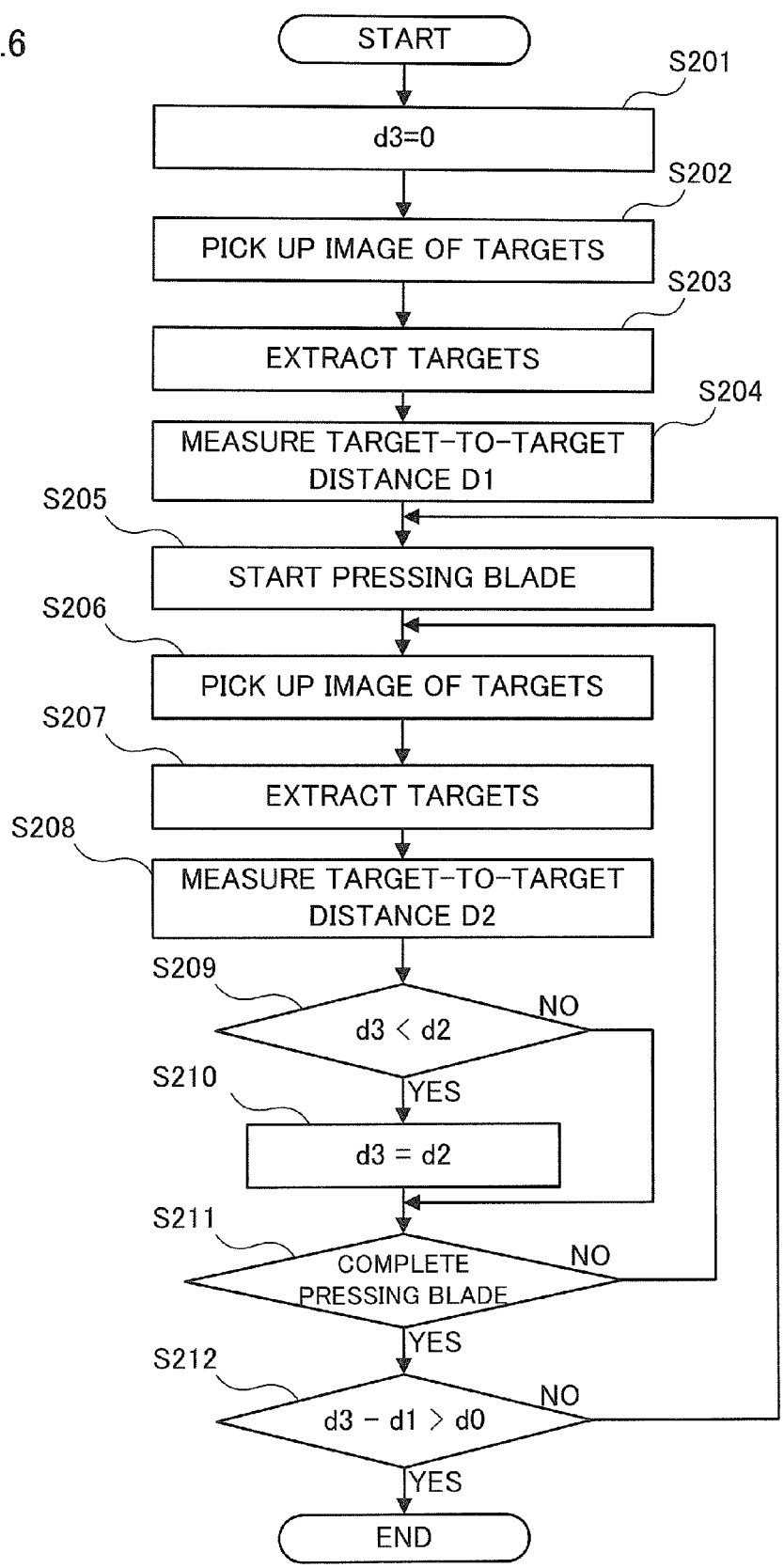

METHOD FOR CUTTING SUBSTRATE AND METHOD FOR MANUFACTURING ELECTRONIC ELEMENT

CROSS REFERENCE TO RELATED APPLICATIONS

This application is a National Stage of International Application No. PCT/JP2010/050557 filed Jan. 19, 2010, which claims priority from Japanese Patent Application No. 2009-017512, filed Jan. 29, 2009, the contents of all of which are incorporated herein by reference in their entirety.

TECHNICAL FIELD

The present invention relates to a method for cutting a substrate, such as a semiconductor wafer, having multiple electronic elements formed thereon to flake (chip) the substrate, and relates to a method for manufacturing electronic elements using the method for cutting a substrate.

BACKGROUND ART

A breaking method and a dicing method are widely used as a method for cutting and chipping a substrate, such as a semiconductor wafer, having electronic elements formed thereon. In the breaking method, after a surface of the substrate is scratched with a diamond tool, a roller is pushed to cut the substrate in a mechanical manner by use of cleavage. In the dicing method, a disk-shaped diamond saw is rotated to cut the substrate. Also in the dicing method where a diamond saw is used, a substrate is given an incision in partway and then cut into chips by breaking, in addition to complete cutting of the substrate.

Additionally, in recent years, a so-called stealth dicing method has been developed in which a laser beam having a permeable wavelength is concentrated by an object lens optical system and is emitted so that the laser beam comes into a focus inside of the substrate, and thereby a region having lower strength than that before the emission is formed inside of the substrate. This method provides an end face having a small edge for cutting and a small amount of chippage. However, in the state where a region having lower strength is formed inside of the substrate, the substrate is not cut but still connected. Accordingly, it is necessary to cut the substrate into chips by breaking.

Patent Literature 1 describes a method for cutting a substrate into chips and an apparatus for this purpose. In this method, (1) in the substrate to be cut, a trench or a processed modified layer serving as a start point of breakdown is formed in advance by laser, scribe, dicer or the like, (2) after adjustment is made so that a blade having an acute tip is brought into contact with the opposite surface of the trench serving as a start point of breakdown, (3) impact force is applied to push the blade into the substrate, and thereby the substrate is cut by breaking.

CITATION LIST

Patent Literature

Patent Literature 1: Japanese Patent Application Laid-Open Publication No. 2004-39931

SUMMARY OF INVENTION

Technical Problem

In general, when a substrate is cut into chips by breaking, the substrate is stuck on an adhesive sheet in order to prevent the cut chips from flying out.

Thus, there is a problem that it is difficult to judge whether the substrate has been completely cut even when a blade is pushed into the substrate. That is, whether the substrate has been cut is judged by an operator based on an image of the substrate at the time of pushing the blade into the substrate, a sound generated from the substrate at the time of pushing, and the like. When it is judged that the substrate has not been cut or has been cut only partially in the thickness direction of the substrate (half-cut), a step is repeated in which the blade is pushed into the substrate again.

Accordingly, there is a problem that substrate cutting highly depends on experience or guesswork of the operator and thus is not allowed to be automated.

An object of the present invention is to provide a method for cutting a substrate and a method for manufacturing electronic elements using the method by which the cutting state of the substrate can be judged.

Solution to Problem

The inventors take advantage of the fact that the distance between a pair of marks (targets) formed on a substrate with the position for pushing a blade interposed therebetween changes at the time of pushing the blade into the substrate due to warping of the substrate and cutting. By measuring the change, the inventors have found that the cutting situation of the substrate can be judged.

Specifically, the method for cutting a substrate to which the present invention is applied includes the steps of: forming a cutting region in a substrate that has one surface with plural electronic elements formed thereon; pressing a blade against a position on the other surface of the substrate by a driving section, the position corresponding to the position where the cutting region is formed; picking up an image of at least a pair of targets formed on the one surface of the substrate by an image pickup section, in the step of pressing the blade; extracting the pair of targets from the result of picking-up of the targets by an extracting section, and measuring the amount of change of the distance between the targets in the step of pressing the blade by a measuring section; and determining the cutting state of the substrate based on a predetermined setting value and the measured amount of change of the distance between the targets by a determining section. Additionally, the pair of targets is preferably a pair of targets adjacent to each other with a cutting line interposed therebetween.

More preferably, the method further includes the step of repeating from the step of pressing the blade if the amount of change is smaller than a predetermined setting value. This allows for automation of the substrate cutting steps.

Each of the pair of targets is preferably formed so as to interpose the blade pressed against the substrate.

The measured amount of change of the distance between the targets may be the amount of change of the maximum distance between the targets obtained by the image pickup section and the measuring section making repeated measurement during a period from receipt of a signal of blade-pressing start to receipt of a signal of blade-pressing completion from the driving section.

Additionally, the cutting region is preferably a region having lower strength due to grooving or laser processing than the cutting region before the grooving or the laser processing.

Furthermore, the substrate is preferably stuck on an adhesive sheet. This has an advantage of reducing flying out of chips.

In another aspect of the present invention, the method for manufacturing electronic elements formed on a substrate to which the present invention is applied includes the steps of: forming a cutting region in the substrate that has one surface with plural electronic elements formed thereon; pressing a blade against a position on the other surface of the substrate by a driving section, the position corresponding to the position where the cutting region is formed; picking up an image of at least a pair of targets formed on the one surface of the substrate by an image pickup section, in the step of pressing the blade; extracting the pair of targets from the result of picking-up of the targets by an extracting section, and measuring the amount of change of the distance between the targets in the step of pressing the blade by a measuring section; and determining the cutting state of the substrate based on a predetermined setting value and the measured amount of change of the distance between the targets by a determining section. Additionally, the pair of targets is preferably a pair of targets adjacent to each other with a cutting line interposed therebetween.

The method may be a method for manufacturing light-emitting elements (LEDs).

ADVANTAGEOUS EFFECTS OF INVENTION

Determination of the situation of substrate cutting according to the present invention has an advantage that the steps for substrate cutting can be automated. Thereby, as compared with a conventional method in which the situation of substrate cutting is determined by human operations, yields of cut products are improved, and an increase in productivity and a substantial reduction in cost can be achieved.

BRIEF DESCRIPTION OF DRAWINGS

FIGS. 4A to 4D are diagrams illustrating an outline of a method for cutting a substrate and a method for manufacturing electronic elements using the method according to the exemplary embodiment;

FIG. 5 is a flowchart of a first method according to the exemplary embodiment for judging the cutting situation of the substrate; and FIG. 6 is a flowchart of a second method according to the exemplary embodiment for judging the cutting situation of the substrate.

DESCRIPTION OF EMBODIMENTS

Figure 1:
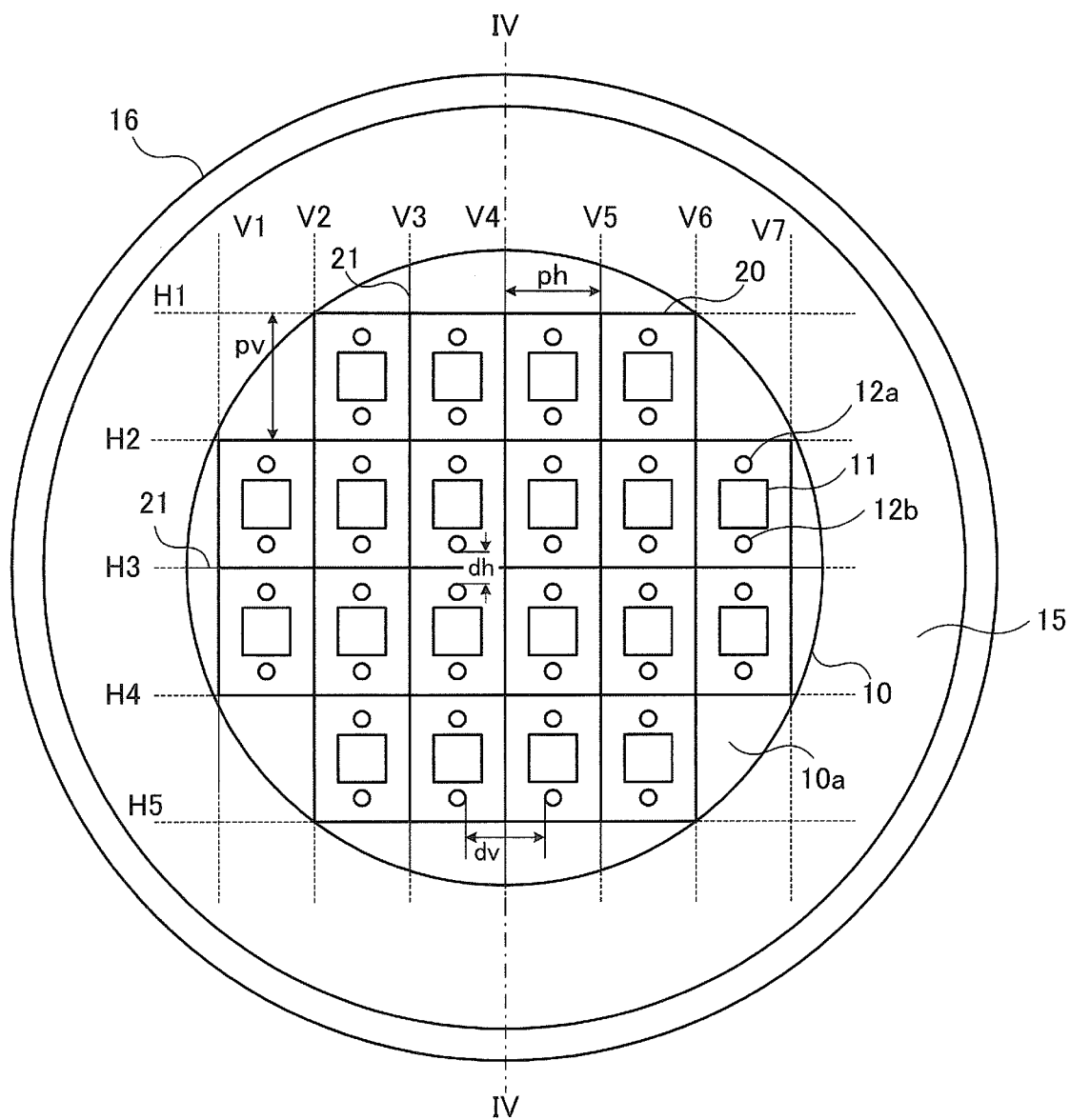
FIG. 1 is a diagram illustrating an example of a substrate used in the exemplary embodiment.

An exemplary embodiment of the present invention will be described below in detail with reference to the accompanying drawings. The same reference numerals will be used for the same components, and a repeated description thereof will be omitted. Note that a substrate, chips and the like are schematically illustrated in the accompanying drawings, and thus the scale thereof is not accurate.

FIG. 1 is a diagram illustrating an example of a substrate 10 used in the present exemplary embodiment. FIG. 1 is a diagram of the substrate 10 seen from the front surface thereof, and together with this, FIG. 1 shows a metal ring 16 attached with an adhesive sheet 15 on which the substrate 10 is stuck.

The substrate 10 is a single-crystal sapphire substrate having an outer diameter of 4 inches (about 100 mm) and a thickness of 120 μm, for example. On the substrate 10, an n-type semiconductor layer, a light-emitting layer and a p-type semiconductor layer composed of a group III nitride semiconductor are layered in this order, and plural light-emitting diode (LED) elements 11 (hereinafter, referred to as LEDs 11) are formed as an example of electronic elements. The substrate 10 is also provided with electrodes 12a and electrodes 12b for supplying currents to the respective LEDs 11. Each of the electrodes 12a and 12b has a circular shape having a diameter of 100 μm, for example.

It is preferable to employ a manufacturing method by which an intermediate layer and a base layer composed of a group III nitride compound, for example, are formed between the substrate 10 and the n-type semiconductor layer, and the n-type semiconductor layer, the light-emitting layer and the p-type semiconductor layer are sequentially layered. For example, pursuant to the method described in Japanese Patent Application Laid-Open Publication No. 2008-124060, a substrate 10 may be prepared that includes plural LEDs 11 having an intermediate layer, a base layer, an n-type semiconductor layer, a light-emitting layer, a p-type semiconductor layer, electrodes and the like.

The size (inches) of the outer diameter of the substrate 10 and the thickness of the substrate material are arbitrary selected. In the present invention, the thickness of the substrate material is preferably adjusted in a range from about 50 μm to 300 μm in a polishing and grinding step, to use the substrate 10.

The substrate material usable for the present invention is not particularly limited, and various materials can be selected to use. Listed as examples thereof are: sapphire, carbonized silicon (silicon carbide: SiC), silicon, zinc oxide, magnesium oxide, manganese oxide, zirconium oxide, manganese zinc iron oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten, molybdenum, gallium nitride, and the like. Among these, sapphire and carbonized silicon (silicon carbide: SiC) are preferable.

The LEDs 11 provided with the electrodes 12a and 12b are arranged on the substrate 10 at regular intervals. In one example, chips 20 are rectangular, and are shown in FIG. 1 at intervals of the width ph and the length pv. However, the size of the chips 20 is arbitrarily selected. For example, a rectangular shape with ph=240 μm and pv=500 μm, or a square shape with ph=pv=350 μm is used. The chips 20 are cut from the substrate 10, and each are used for packages (lamps) by being mounted. Cutting lines V1 to V7 and H1 to H5 in FIG. 1 indicate cutting locations for cutting the substrate 10 into the chips 20.

In the present exemplary embodiment, an image of plural marks (targets) formed on the substrate 10 is picked up with a camera, the distances between the targets are measured at the time of cutting into the chips 20, and thereby the cutting state of the substrate 10 is judged.

The electrodes 12a and 12b formed on the substrate 10 are used herein as an example of targets. Specifically, if the shorter edge side of the chips 20 is to be cut (the cutting lines H1 to H5), the distance between the adjacent electrode 12a and electrode 12b of adjacent two chips 20 is measured. For example, the distance dh between electrodes 12a and 12b is measured that are adjacent to each other with a blade 57 (see FIG. 2 to be described later) interposed therebetween (that is, adjacent with the cutting line H3 interposed therebetween). Meanwhile, if the longer edge side of the chips 20 is to be cut (the cutting lines V1 to V7), the distance between the electrodes 12b of adjacent two chips 20 is measured. For example, the distance dv between two electrodes 12b is measured that are adjacent to each other with the cutting line V4 interposed therebetween.

Moreover, along the cutting lines V1 to V7 and H1 to H5, the substrate 10 is provided with cutting regions 21 that are formed by being irradiated with concentrated pulse laser beams of excimer excitation and have low strength. Since the cutting regions 21 have lower strength than those before the irradiation, the cutting regions 21 serve as starting points of breakdown at the time of cutting the substrate 10 into the chips 20. A method for forming the cutting regions 21 having low strength by irradiation of pulse laser beams of excimer excitation will be described later.

The substrate 10 is stuck on the adhesive sheet 15 attached to the metal ring 16 (see FIG. 4B to be described later). The adhesive sheet 15 holds the chips 20 having been cut, to thereby prevent the cut chips 20 from flying out. The substrate 10 herein has a front surface 10a whose side is stuck on the adhesive sheet 15, the front surface 10a having the LEDs 11 and the like formed thereon. Thus, FIG. 1 shows the substrate 10 seen through the adhesive sheet 15. Since the adhesive sheet 15 is transparent, an image of targets formed on the substrate 10 can be picked up with a camera.

Additionally, although it is only an example, the metal ring 16 has an inner diameter of 190 mm, which is set to be larger than the diameter 4 inches (about 100 mm) of the substrate 10. The substrate 10 is stuck on the inside of the metal ring 16 so as not to be in contact with the metal ring 16.

After the substrate 10 is cut into the chips 20, the adhesive sheet 15 is pushed up by a cylinder at the inside of the metal ring 16, to be stretched. Thereby, gaps between the chips 20 are widened, which simplifies an operation of mounting onto packages.

Figure 2:
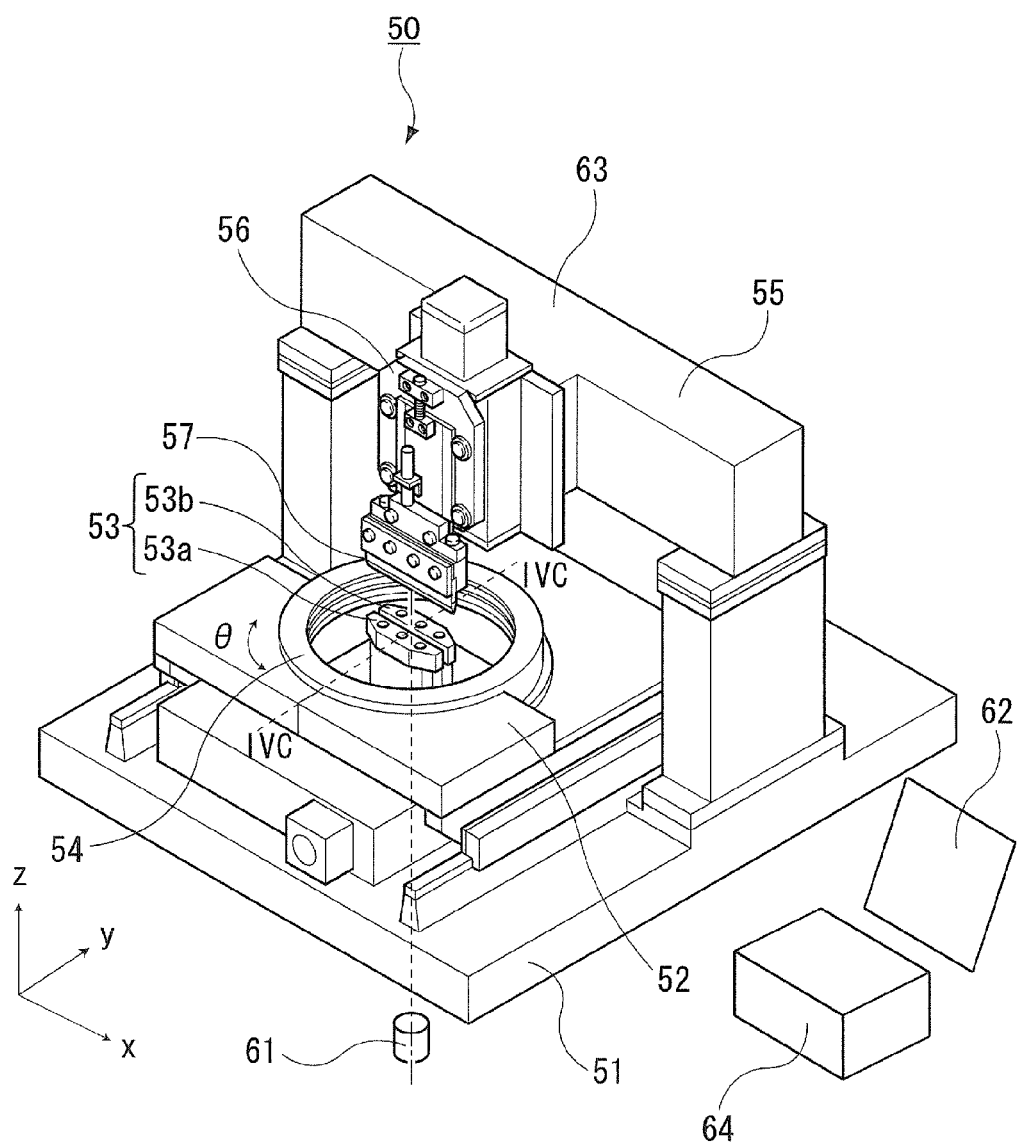
FIG. 2 is a diagram illustrating an example of a substrate cutting apparatus to which the exemplary embodiment is applied.

FIG. 2 is a diagram illustrating an example of a substrate cutting apparatus 50 to which the present exemplary embodiment is applied.

The substrate cutting apparatus 50 is provided on a base 51 for installation on a platform or the like, and includes a stage 52 movable on the base 51 in a front-back direction (referred to as y direction). The stage 52 includes a ring table 54 that is formed of a ring-like frame rotatable on the stage 52 (the rotation direction thereof is referred to as •-axis direction). The metal ring 16 attached with the adhesive sheet 15 on which the substrate 10 shown in FIG. 1 is stuck is installed on the ring table 54.

Moreover, the substrate cutting apparatus 50 includes a receiving mount 53 that is provided on the base 51 and holds the substrate 10 stuck on the adhesive sheet 15.

Additionally, the substrate cutting apparatus 50 includes a gate-like support 55 provided on the base 51. The support 55 includes a blade holder 56. The blade holder 56 has one edge to hold the blade 57. The blade holder 56 is configured to be movable in an up-and-down direction (referred to as z-axis direction) with respect to the base 51.

The blade 57 is pushed into the substrate 10 to cut the substrate 10. Thus, the blade 57 is in the form of a knife having a 60 degree tip, for example, and is made of superhard steel or zirconia, for example. The width of the blade 57 is set to be larger than the diameter of the substrate 10. For example, the width of the blade 57 is 110 mm.

The receiving mount 53 is composed of two receiving mounts 53a and 53b arranged to face each other. The front surfaces of the receiving mounts 53a and 53b are made of superhard steel, for example, so as not to deform when the blade 57 is pushed into the substrate 10. The receiving mount 53 is configured so that the blade 57 goes into the gap between the receiving mounts 53a and 53b when the blade 57 is moved in the direction to the receiving mount 53 (the −z-axis direction).

Moreover, the front surface of the receiving mount 53 and that of the ring table 54 are set so as to be located in almost one plane.

The substrate cutting apparatus 50 includes an image pickup section 61 composed of a CCD camera, for example, at a lower portion of the receiving mount 53. The image pickup section 61 is configured to be capable of picking up images of the substrate 10 on the receiving mount 53 through the gap between the two receiving mounts 53a and 53b. The substrate cutting apparatus 50 includes a displaying section 62 that displays image data picked up by the image pickup section 61.

Additionally, in the support 55, the substrate cutting apparatus 50 includes a driving section 63 that is composed of a stepping motor for moving the blade holder 56 in the z-axis direction, a motor for moving the stage 52 in the y-axis direction, a motor for rotating the ring table 54 in the •-axis direction and an electronic circuit to control these motors.

In addition, the substrate cutting apparatus 50 includes a controlling section 64 that extracts a pair of targets adjacent to each other with a cutting line interposed therebetween from the image data picked up by the image pickup section 61, measures the distance between the targets, and determines the cutting situation based on the amount of change of the distance between the targets.

Figure 3:
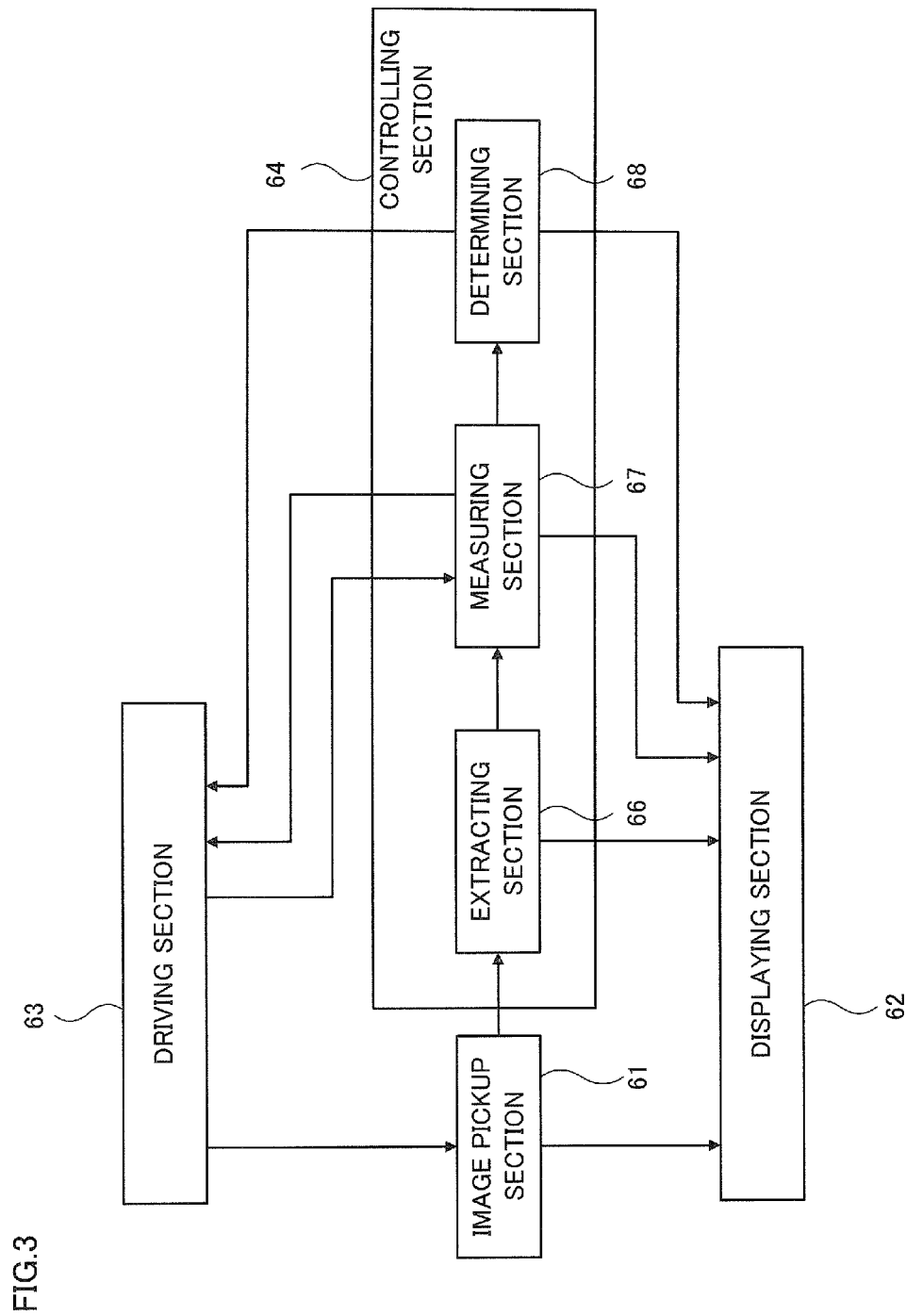
FIG. 3 is a block diagram focusing on the controlling section of the substrate cutting apparatus.

FIG. 3 is a block diagram focusing on the controlling section 64 of the substrate cutting apparatus 50 to which the present exemplary embodiment is applied. The controlling section 64 includes: an extracting section 66 extracting a target whose shape coincides with the shape of a target registered in advance, from image data picked up by the image pickup section 61; a measuring section 67 measuring the distance between a pair of targets; and a determining section 68 determining the cutting situation based on the amount of change of the distance between the targets with respect to a setting value. The displaying section 62 displays the image data picked up by the image pickup section 61, the targets extracted by the extracting section 66, the distance between the targets measured by the measuring section 67, the amount of change between the distance of the targets with respect to the setting value used for determination of the cutting situation by the determining section 68, and the like. Moreover, the driving section 63 is controlled on the basis of the determination result of the determining section 68. As will be described later, the image pickup section 61, the driving section 63 and the controlling section 64 operate in conjunction with each other.

FIGS. 4A to 4D are diagrams illustrating an outline of a method for cutting a substrate and a method for manufacturing electronic elements using the method according to the present exemplary embodiment.

In FIGS. 4A to 4D, the substrate 10 is shown by using the IV-IV cross section of the substrate 10 shown in FIG. 1. At this cross section, four chips 20 are seen. The LED 11, which is an example of an electronic element, and the electrodes 12a and 12b are formed in each of the chips 20.

Since the LEDs 11 and the electrodes 12a and 12b are formed by a well known method, a detailed description of a method for forming the LEDs 11 and the electrodes 12a and 12b is omitted herein.

After the LEDs 11 and the like are formed on the substrate 10, the cutting regions 21 having low strength are formed in the substrate 10, as shown in FIG. 4A. As an example, a description is herein made of a case where the cutting region 21 is formed along the cutting line H2.

An inner portion of the substrate 10 corresponding to the cutting line H2 is irradiated with a pulse laser beam 41 of excimer excitation concentrated by an object lens 42. At this time, the substrate 10 is scanned along the cutting line H2 while being irradiated with the pulse laser beam 41 of excimer excitation. By this operation, the material of the substrate 10 is heated to volatilize, and thereby the cutting region 21 that has low strength and serves as a starting point of breakdown at the time of cutting is formed inside of the substrate 10 along the cutting line H2. The step of forming the cutting region 21 that has low strength and serves as a starting point of breakdown at the time of cutting is herein referred to as a step of forming a cutting region.

Note that, although it is only an example, the pulse laser beam 41 of excimer excitation has a wavelength of 355 nm and a pulse period ranging from 10 kHz to 50 kHz. The scanning speed is from 50 mm/sec to 300 mm/sec.

Similarly, by scanning of the pulse laser beam 41 of excimer excitation for the cutting lines H1 and H3 to H5, the cutting regions 21 having low strength are formed at inner portions of the substrate 10 corresponding to the cutting lines H1 to H5.

Furthermore, the cutting regions 21 having low strength are similarly formed at inner portions of the substrate 10 corresponding to the cutting lines V1 to V7.

Next, the front surface 10a of the substrate 10 is stuck on an adhesive surface 15a of the adhesive sheet 15 attached to the metal ring 16, as shown in FIG. 4B, the front surface 10a having the LEDs 11 and the like formed thereon. Since the inner diameter of the metal ring 16 is larger than the outer diameter of the substrate 10, the front surface 10a is stuck so that the substrate 10 is arranged inside of the metal ring 16.

Since the metal ring 16 is also stuck on the adhesive surface 15a of the adhesive sheet 15, the substrate 10 and the metal ring 16 are arranged on the same side with respect to the adhesive sheet 15.

Next, as shown in FIG. 4C, the substrate 10 stuck on the adhesive sheet 15 and the metal ring 16 holding the substrate 10 and the adhesive sheet 15 are installed on the ring table 54 of the substrate cutting apparatus 50 shown in FIG. 2. In FIG. 4C, the receiving mounts 53a and 53b, the ring table 54 and the blade 57 are shown by using the cross sections thereof obtained by cutting along a plane including the IVC-IVC line and the z-axis in FIG. 2. Thus, the cross section of the acute cutting edge of the blade 57 is seen in FIG. 4C.

As described above, since the front surface of the ring table 54 and the front surfaces of the receiving mounts 53a and 53b are set so as to be located in one plane, the substrate 10 is installed on the receiving mounts 53a and 53b.

In FIG. 4C, a case where cutting at the cutting lines H1 and H2 is finished and the cutting line H3 is going to be cut is shown as an example. Here, the cutting line H3 of the substrate 10 and the position of the cutting edge of the blade 57 are adjusted to coincide with each other.

The cutting line of the substrate 10 and the position of the cutting edge of the blade 57 are adjusted as follows. Before the substrate 10 is installed on the receiving mount 53, a mark that is provided for the image pickup section 61 and serves as a reference is adjusted so that the mark of the image pickup section 61 and the position of the blade 57 coincide with each other. After that, the substrate 10 is installed on the receiving mount 53, and the mark and the cutting line H3 of the substrate 10 are made to coincide with each other. At this time, based on image data of the substrate 10 from the image pickup section 61, the driving section 63 adjusts rotation of the substrate 10 in the •-axis direction by using a rotation mechanism of the ring table 54 and further adjusts the position of the substrate 10 in the y-axis direction by using a movement mechanism of the stage 52.

After that, as shown in FIG. 4C, the driving section 63 moves the blade holder 56 in the −z-axis direction (toward the substrate 10). Then, the driving section 63 moves the blade 57 attached to the blade holder 56 from the state shown with a solid line to the state shown with a broken line, to cause the blade 57 to be brought into contact with a back surface 10b of the substrate 10.

Next, as shown in FIG. 4D, the blade 57 is pushed into the substrate 10 by the amount of push b that is set in advance. The amount of push b is 100 μm, which is an example.

The amount of push b refers to the distance by which the blade 57 is moved in the −z-axis direction where the position of the substrate 10 (the position of the substrate 10 indicated with the broken line) with which the blade 57 is brought into contact is set to be 0, as shown in FIG. 4D.

Then, since the cutting region 21 that has low strength and serves as a starting point for cutting is formed at an inner portion of the substrate 10 corresponding to the cutting line H3, the substrate 10 is cut at the position of the cutting line H3.

The blade 57 immediately returns to the original position when pushing is finished.

The step in which the driving section 63 causes the blade 57 to be brought into contact with a cutting line of the substrate 10 and further causes the blade 57 to be pushed into the substrate 10 is herein referred to as a step of pressing a blade.

Similarly, the step of pressing the blade is performed at the positions of the cutting lines H4 and H5, and thereby the substrate 10 is cut at the positions of the cutting lines H4 and H5.

Furthermore, the step of pressing the blade is similarly performed at the positions of the cutting lines V1 to V7, and thereby the substrate 10 is cut at the positions of the cutting lines V1 to V7.

In this manner, electronic elements divided into LED chips are manufactured.

Next, a description is given of a method for judging the cutting situation of the substrate 10 in the method for cutting a substrate according to the present exemplary embodiment.

FIG. 5 is a flowchart of a first method for judging the cutting situation of the substrate 10. With reference to FIGS. 3, 4C, 4D and 5, a description is given of the first method for judging the cutting situation. Also here, the case where the substrate 10 is cut at the cutting line H3 is described as an example. Assume that the position of the blade 57 is set so that the blade 57 can be brought into contact with the cutting line H3.

First, the image pickup section 61 picks up an image including the electrodes 12a and the electrodes 12b between which the cutting line H3 (the blade 57) is interposed (the step of picking up) (Step 101 in FIG. 5). Upon receipt of image data picked up by the image pickup section 61, the extracting section 66 extracts image data of the electrodes 12a and the electrodes 12b between which the cutting line H3 (the blade 57) is interposed (Step 102). For example, the image data of the electrodes 12a and the electrodes 12b is taken out from the luminance distribution of the image data obtained from the image pickup section 61, on the basis of the shape of the electrodes registered as the shape of targets. Image data of a pair of the electrode 12a and the electrode 12b which is formed with the blade 57 interposed therebetween, in other words, formed with the cutting line H3 interposed therebetween is selected as targets from the image data of the electrodes 12a and the electrodes 12b.

Next, based on the selected image data of the pair of the electrode 12a and the electrode 12b, the measuring section 67 measures the distance d1 between the electrode 12a and the electrode 12b (the step of measuring) (Step 103). For example, the selected image data of the pair of the electrode 12a and the electrode 12b is processed so that the edge thereof is enhanced, and the distance is measured based on the number of pixels of the edges between the pair of the electrode 12a and the electrode 12b. Then, the value of the distance d1 is stored in a storage area included in the measuring section 67 for storage of the distance d1. The measuring section 67 then transmits a signal of completion of measuring the distance d1 to the driving section 63.

Next, upon receipt of the signal of completion of measuring the distance d1 from the measuring section 67, the driving section 63 presses the blade 57, as shown in FIG. 4D (Step 104). The driving section 63 then transmits a signal of blade-pressing start to the image pickup section 61.

When the blade 57 is pressed against the substrate 10, the substrate 10 is pressed by the blade 57 to become warped and starts to break from the cutting region 21 having low strength as a starting point. At this time, the distance between the electrode 12a and the electrode 12b is widened by warping of the substrate 10. Moreover, when the substrate 10 is cut, the blade 57 goes between the chips 20 of the cut substrate 10, which further widens the distance between the electrode 12a and the electrode 12b.

At this time, upon receipt of the signal of blade-pressing start from the driving section 63, the image pickup section 61 picks up an image including the pair of the electrode 12a and the electrode 12b, which are the targets (the step of picking up) (Step 105). Upon receipt of image data from the image pickup section 61, the extracting section 66 extracts image data of the same pair of the electrode 12a and the electrode 12b as that extracted in Step 102 (Step 106).

The measuring section 67 then measures the distance d2 between the pair of the electrode 12a and the electrode 12b, which are the targets, similarly to Step 103 (Step 107). The distance d2 is stored in a storage area included in the measuring section 67 for storage of the distance d2. Then, the measuring section 67 calculates (the step of measuring) the amount of change (d2-d1) of the target-to-target distance, which is a value related to a change of the distance between the targets, and transmits the amount of change to the determining section 68.

Then, on the basis of the amount of change (d2-d1) of the target-to-target distance received from the measuring section 67, the determining section 68 determines the cutting state of the substrate 10 (the step of determining) (Step 108). A setting value d0 is stored in a storage area of the determining section 68 as a criterion for judging a predetermined cutting situation (criterion for judgment). For example, the setting value d0 is set at 30 µm. If the value of the amount of change (d2-d1) is in 0 µm to 30 µm, it is judged that the substrate 10 is in a state where cutting is not performed or in an incomplete cutting state (half-cut) where cutting is performed in partway in the thickness direction of the substrate 10. If the value of the amount of change (d2-d1) is more than 30 µm, it is judged that the substrate 10 has been cut. That is, the cutting situation is automatically determined on the basis of the value from 0 to 30 µm that is set by an operator as the criterion for judgment (in this case, the setting value is 30 µm). In the present invention, preferably a value of 100 µm or less, more preferably a value of 50 µm or less, or more desirably a value of 30 µm or less is arbitrarily set as the setting value. The setting value may be varied in accordance with the shape of the LEDs 11 at the time of cutting locations corresponding to the width and length thereof, and is preferably set at a value in a range of 1 µm to 50 µm.

Then, if the determining section 68 determines that the substrate 10 is in the state where cutting is not performed or in the incomplete cutting state (half-cut), the determining section 68 may transmit to the driving section 63 a signal instructing the driving section 63 to press the blade 57 against the substrate 10 again (No in Step 108). The driving section 63 then repeats the step (Step 104) of pressing the blade 57 against the substrate 10.

When the blade 57 is pressed against the substrate 10 again, the amount of push b of the blade 57 may be set larger than the previous amount of push. This is because the same amount of push b may not allow the substrate 10 to be cut. After that, Steps 105 to 107 are performed to automatically determine the cutting state of the substrate 10.

If the determining section 68 determines that the substrate 10 has been cut, a series of operations is finished. The determining section 68 transmits a signal of cutting completion to the driving section 63. Then, the driving section 63 moves the stage 52.

In this manner, a series of the above operations is repeated, for example, for each of the cutting lines H4 and H5 that have not been cut on the substrate 10. Thereby, cutting for the cutting lines H1 to H5 of the substrate 10 is finished.

If the length pv of the longer edge of each chip 20, which is the interval (pitch) of the cutting lines H1 to H5, is set in the substrate cutting apparatus 50, the stage 52 may be automatically moved in the −y direction with pv as a unit. Accordingly, cutting for the cutting lines H1 to H5 is automatically performed by using the above method for judging the cutting state of a substrate. At this time, if the positions of the cutting lines H1 to H5 are recognized by image recognition and a fine adjustment is automatically made to the relationship between the positions of the cutting lines H1 to H5 and the position of the blade 57, the substrate 10 can be cut at the more accurate positions of the cutting lines H1 to H5.

After that, the substrate 10 is automatically rotated by 90 degrees on the ring table 54. Then, by repeating a series of the above operations for the cutting lines V1 to V7 of the substrate 10 in numerical order, the substrate 10 can be cut into the chips 20.

In this manner, the steps for substrate cutting can be automated.

In the first method for judging the cutting situation of the substrate 10 shown in the flowchart of FIG. 5, Step 105 for picking up an image of targets is provided after Step 104 for pressing the blade 57. However, it is conceivable that the target-to-target distance d2 of the substrate 10 having been cut becomes narrower than when the distance is most widened because the blade 57 returns to the original position after the blade 57 is pushed down. For this reason, it is conceivable that the amount of change (d2-d1) of the measured target-totarget distance becomes a smaller value than the setting value d0 and thus the steps for substrate cutting (Steps 104 to 108) are unnecessarily repeated.

To prevent this, it is conceivable that Step 105 for picking up an image of targets is performed in parallel with Step 104 for pressing the blade 57. However, even in this case, it is conceivable that depending on the timing of Step 105 for picking up an image of targets, the target-to-target distance d2 of the substrate 10 having been cut becomes narrower than when the distance is most widened and thus the amount of change (d2-d1) of the target-to-target distance becomes a smaller value than the setting value d0.

FIG. 6 is a flowchart of a second method for judging the cutting situation of the substrate 10 more accurately.

The methods in FIGS. 5 and 6 differ in that in FIG. 6, upon receipt of the signal of blade-pressing start from the driving section 63, the image pickup section 61 and the measuring section 67 repeat measurement of the target-to-target distance d2 until receipt of a signal of blade-pressing completion from the driving section 63. Additionally, the difference is in that from the repeatedly measured values of the target-to-target distance d2, the maximum distance d3 among the target-to-target distances d2 is obtained.

Also here, the case where the substrate 10 is cut at the cutting line H3 is described as an example. Assume that the position of the blade 57 is set so that the blade 57 can be brought into contact with the cutting line H3.

First, the measuring section 67 sets a storage area included in the measuring section 67 for storage of the maximum distance d3 to be 0 (Step 201).

Next, similarly to Step 101 in FIG. 5, the image pickup section 61 picks up an image including the electrodes 12a and the electrodes 12b between which the cutting line H3 (the blade 57) is interposed (the step of picking up) (Step 202). Upon receipt of image data picked up by the image pickup section 61, the extracting section 66 extracts image data of the electrodes 12a and the electrodes 12b between which the cutting line H3 (the blade 57) is interposed (Step 203). Then, the extracting section 66 selects, as targets, image data of a pair of the electrode 12a and the electrode 12b which is formed with the cutting line H3 interposed therebetween.

Next, based on the selected image data of the pair of the electrode 12a and the electrode 12b, the measuring section 67 measures the distance d1 between the electrode 12a and the electrode 12b, and stores the value of the distance d1 in the storage area included in the measuring section 67 for storage of the distance d1 (Step 204). The measuring section 67 then transmits a signal of completion of measuring the distance d1 to the driving section 63.

Then, upon receipt of the signal of completion of measuring the distance d1 from the measuring section 67, the driving section 63 presses the blade 57 (Step 205). The driving section 63 then transmits a signal of blade-pressing start to the image pickup section 61.

Upon receipt of the signal of blade-pressing start from the driving section 63, the image pickup section 61 picks up an image including the electrodes 12a and the electrodes 12b (the step of picking up) (Step 206). Upon receipt of image data from the image pickup section 61, the extracting section 66 extracts image data of the same pair of the electrode 12a and the electrode 12b as that extracted in Step 203 (Step 207).

The measuring section 67 then measures the distance d2 between the pair of the electrode 12a and the electrode 12b, which are the targets, similarly to Step 204 (Step 208). The distance d2 is compared with the maximum distance d3 stored in the storage area of the measuring section 67 for storage of d3 (Step 209). If d3 is smaller than d2, d2 is stored, as d3, in the storage area of the measuring section 67 for storage of the maximum distance d3 (Step 210). If d3 is equal to or larger than d2, the value of the storage area for the maximum distance d3 is not changed.

Steps 206 to 210 are repeated until the measuring section 67 receives a signal of blade-pressing completion from the driving section 63 (Step 211). By this operation, the value of the storage area for storage of the maximum distance d3 becomes the maximum value of the target-to-target distances d2.

When pressing of the blade is finished, the driving section 63 transmits a signal of blade-pressing completion to the measuring section 67 (Step 211).

Then, the measuring section 67 calculates the amount of change (d3-d1) of the target-to-target distance (the step of measuring) and transmits the amount of change to the determining section 68.

The determining section 68 compares the amount of change (d3-d1) of the target-to-target distance received from the measuring section 67 with the setting value d0 stored in advance in the storage area of the determining section 68 (Step 212). Then, as described in the first method for judging the cutting situation, it is determined whether the blade 57 is pressed against the substrate 10 again or a series of operations is finished, on the basis of the setting value d0 for judging the cutting state (the step of determining).

After that, as described in the first method for judging the cutting situation, if the determining section 68 determines that the substrate 10 is in the state where cutting is not performed or in the incomplete cutting state (half-cut), the determining section 68 may transmit to the driving section 63 a signal instructing the driving section 63 to press the blade 57 against the substrate 10 again (No in Step 212). The driving section 63 then repeats the step (Step 205) of pressing the blade 57 against the substrate 10.

If the determining section 68 determines that the substrate 10 has been cut, a series of operations is finished. The determining section 68 transmits a signal of cutting completion to the driving section 63. Then, the driving section 63 moves the stage 52.

In this manner, a series of the above operations is repeated, for example, for each of the cutting lines H4 and H5 that have not been cut on the substrate 10. Thereby, cutting for the cutting lines H1 to H5 of the substrate 10 is finished. Then, by repeating a series of the above operations for the cutting lines V1 to V7 of the substrate 10 in numerical order, the substrate 10 can be cut into the chips 20.

Since this method provides the maximum value of the target-to-target distances d2, the cutting state of the substrate 10 can be judged more accurately. Preventing unnecessary repetition of the steps for substrate cutting permits shortening time required for the substrate cutting.

As has been described above, according to the present exemplary embodiment, the cutting state of the substrate 10 can be judged, and thus the steps for substrate cutting can be automated.

Although single-crystal sapphire is used for the substrate 10 in the present exemplary embodiment, the substrate 10 may be a semiconductor based on silicon (Si), SiC or GaAs, glass, ceramic or the like. Even if the substrate 10 is opaque to visible light, an image of targets can be picked up because the substrate 10 is installed upside down.

Although the LEDs 11 are assumed to be formed on the substrate 10 as an example of electronic elements, the electronic elements are not limited to the LEDs 11 but may be an integrated circuit such as LSI, or micro electro mechanical systems (MEMS) or the like in which a mechanical system is embedded together with an electric or electronic circuit.

In the present exemplary embodiment, the cutting regions 21 having low strength are formed inside of the substrate 10 of single-crystal sapphire by the pulse laser beam 41 of excimer excitation, and are used as starting points for cutting. However, trenches may be formed on the surface of the substrate 10 by laser processing, scribe processing or dicing processing, to make the cutting regions 21. It is sufficient that regions serving as starting points for cutting are formed in the substrate 10.

As the pulse laser beam 41 of excimer excitation, one having a wavelength of 266 nm may be used. $CO_2$ laser, YAG (yttrium aluminum garnet) laser or YLF (yttrium lithium fluoride) laser may be used.

In the present exemplary embodiment, the electrodes 12a and 12b formed on the front surface of the substrate are used as the targets. However, other patterns may be used, or purpose-built patterns suitable for measuring the distance by image processing may be formed.

Furthermore, although a method based on luminance distribution and edge enhancement is employed for extracting targets and measuring the distance between a pair of targets, a method in which color information is used or other methods may be employed.

Furthermore, although the front surface 10a of the substrate 10 on which electronic elements such as the LEDs 11 are formed is stuck on the adhesive sheet 15 in the present exemplary embodiment, the back surface 10b of the substrate 10 may be stuck on the adhesive sheet 15. Then, the camera of the image pickup section 61 will pick up an image of targets on the substrate 10 through the adhesive sheet 15 and the substrate 10. However, the picking-up will not be prevented as long as the substrate 10 is transparent like single-crystal sapphire.

In the present exemplary embodiment, the adhesive sheet 15 is stuck only on the front surface 10a of the substrate 10 so that the chips 20 do not fly out. However, the adhesive sheet 15 may also be stuck on the back surface 10b of the substrate 10 together with the front surface 10a of the substrate 10 in order to prevent the blade 57 from being damaged due to direct pressing of the blade 57 against rigid single-crystal sapphire, to prevent the cut chips 20 from flying out or moving, to reduce warping at the time of pushing the blade 57, or the like.

EXAMPLE

Next, the present invention is described in further detail with examples. However, the present invention is not limited to these examples.

First, by reference to the method described in Japanese Patent Application Laid-Open Publication No. 2008-124060, an intermediate layer composed of AlN having a thickness of about 40 μm was formed on a substrate of single-crystal sapphire having an outer diameter of 4 inches (about 100 mm). Then, a base layer, an n-type semiconductor layer, a light-emitting layer, a p-type semiconductor layer, electrodes 12a (diameter •100 μm) and electrodes 12b (diameter •100 μm), and the like that were composed of GaN and had a thickness of about 4 μm were formed by using the MOCVD method.

Thereby, the substrate 10 including plural LEDs 11 was prepared. The back surface 10b of the substrate 10 having the LEDs 11 was ground and polished by a known method, and thereby the substrate was thinned to about 120 μm in thickness.

In Example 1, for one substrate 10 having plural LEDs 11 formed thereon, at the position corresponding to a strait line (cutting line) with ph and pv shown in FIG. 1 set at 350 μm, the following operations were implemented: the blade 57 (the driving section 63) of the substrate cutting apparatus 50 described with FIG. 2 was pressed against the back surface 10b of the substrate 10; at the time of the pressing, the image pickup section 61 picked up an image of a pair of the electrodes 12a and 12b (targets) adjacent to each other with the cutting line interposed therebetween; then, the extracting section 66 arbitrary selected (extracted) a pair of the targets from the result of picking-up; the measuring section 67 then automatically measured the amount of change of the distance between the electrodes at the time of pressing the blade 57; the substrate 10 was cut while the determining section 68 were automatically making determinations up to 30 μm set in advance.

Next, in Example 2, operations to cut the substrate 10 were implemented by performing the same operations as described in Example 1 except for changing ph and pv shown in FIG. 1 to 240 μm and 500 μm, respectively.

In Comparative Example 1, judgment operations by a human were implemented such as judgment of cutting by observing the cutting situation on the strait line at the time of pressing the blade 57 (the driving section 63), or judgment of cutting by reference to the cutting sound at the time of cutting, with the intervals of ph and pv set at the same sizes as those implemented in Example 1 and without employing automatic measurement and automatic determination steps as described in Example 1.

In Comparative Example 2, judgment operations by a human as those in Comparative Example 1 were implemented with the intervals of ph and pv set at the same sizes as those implemented in Example 2. Table 1 provides a summary of these results. A pass rate of cutting refers to a ratio of the portion cut at the subsequent inspection with respect to the portion intended to be cut.

TABLE 1

|  | Pass Rate of Cutting | Workability |
| --- | --- | --- |
| Example 1 | 99.6% | ⊚ (Significantly Improved) |
| Example 2 | 99.8% | ⊚ (Significantly Improved) |
| Comparative Example 1 | 98.8% | X (Unstable) |
| Comparative Example 2 | 97.9% | X (Unstable) |

The pass rates of cutting for the methods for cutting a substrate in Examples 1 and 2 are 99.6% to 99.8%, which are significantly improved as compared with those in Comparative Examples 1 and 2. Meanwhile, in Comparative Examples 1 and 2, judgment of cutting completion is based on judgment by a human, such as a visual check and hearing of a cutting sound, for example, and thus workability is unstable due to reduction in workability and personal difference with regard to judgment as well as a disadvantage of varying pass rates of cutting for every implementation. Accordingly, in Comparative Examples 1 and 2, reliability of the results is unfavorable. In Examples 1 and 2, workability and reliability of the results are also substantially improved.

Reference Signs List

| 10 | substrate |
| 11 | LED |

-continued

| | |
|---|---|
| 12a, 12b | electrode |
| 15 | adhesive sheet |
| 16 | metal ring |
| 20 | chip |
| 21 | cutting region |
| 50 | substrate cutting apparatus |
| 51 | base |
| 52 | stage |
| 53 | receiving mount |
| 54 | ring table |
| 55 | support |
| 56 | blade holder |
| 57 | blade |
| 61 | image pickup section |
| 62 | displaying section |
| 63 | driving section |
| 64 | controlling section |
| 66 | extracting section |
| 67 | measuring section |
| 68 | determining section |

The invention claimed is:

1. A method for cutting a substrate, comprising the steps of:
forming a cutting region in a substrate that has one surface with a plurality of electronic elements formed thereon;
pressing a blade against a position on the other surface of the substrate by a driving section, the position corresponding to the position where the cutting region is formed;
picking up an image of at least a pair of targets formed on the one surface of the substrate by an image pickup section, in the step of pressing the blade;
extracting the pair of targets from the result of picking-up of the targets by an extracting section, and measuring the amount of change of the distance between the targets in the step of pressing the blade by a measuring section; and
determining the cutting state of the substrate based on a set value and the measured amount of change of the distance between the targets by a determining section.

2. The method for cutting a substrate according to claim 1, wherein the pair of targets is a pair of targets adjacent to each other with a cutting line interposed therebetween.

3. The method for cutting a substrate according to claim 1, further comprising the step of repeating from the step of pressing the blade if the amount of change is smaller than a set value.

4. The method for cutting a substrate according to claim 1, wherein each of the pair of targets is formed so as to interpose the blade pressed against the substrate.

5. The method for cutting a substrate according to claim 1, wherein the measured amount of change of the distance between the targets is the amount of change of the maximum distance between the targets obtained by the image pickup section and the measuring section making repeated measurement during a period from receipt of a signal of blade-pressing start to receipt of a signal of blade-pressing completion from the driving section.

6. The method for cutting a substrate according to claim 1, wherein the cutting region is a region having lower strength due to grooving or laser processing than the cutting region before the grooving or the laser processing.

7. The method for cutting a substrate according to claim 1, wherein the substrate is stuck on an adhesive sheet.

8. A method for manufacturing electronic elements formed on a substrate, comprising the steps of:
forming a cutting region in the substrate that has one surface with a plurality of electronic elements formed thereon;
pressing a blade against a position on the other surface of the substrate by a driving section, the position corresponding to the position where the cutting region is formed;
picking up an image of at least a pair of targets formed on the one surface of the substrate by an image pickup section, in the step of pressing the blade;
extracting the pair of targets from the result of picking-up of the targets by an extracting section, and measuring the amount of change of the distance between the targets in the step of pressing the blade by a measuring section; and
determining the cutting state of the substrate based on a set value and the measured amount of change of the distance between the targets by a determining section.

9. The method for manufacturing electronic elements according to claim 8, wherein the pair of targets is a pair of targets adjacent to each other with a cutting line interposed therebetween.

10. The method for manufacturing electronic elements according to claim 8, wherein the method is a method for manufacturing light-emitting elements (LEDs).

* * * * *